United States Patent [19]

Polischuk

[11] Patent Number: 4,635,297

[45] Date of Patent: Jan. 6, 1987

[54] OVERLOAD PROTECTOR

[75] Inventor: Andrey Polischuk, Succasunna, N.J.

[73] Assignee: Litton Systems, Inc., Morris Plains, N.J.

[21] Appl. No.: 814,292

[22] Filed: Dec. 26, 1985

Related U.S. Application Data

[63] Continuation of Ser. No. 589,812, Mar. 15, 1984, abandoned.

[51] Int. Cl.[4] .................. H04B 1/10; H03G 11/02
[52] U.S. Cl. .................. 455/217; 455/283; 455/117; 333/17 L; 307/565; 328/8
[58] Field of Search .......... 333/17 L, 101, 3; 455/117, 217, 283, 281, 289, 169; 307/362, 542, 565; 328/162, 165, 8; 361/86

[56] References Cited

U.S. PATENT DOCUMENTS

| | | | |
|---|---|---|---|
| 3,396,388 | 8/1968 | Goldie | 343/5 R |
| 3,622,887 | 11/1971 | Byles | 455/289 |
| 3,931,577 | 1/1976 | Barnett | 455/217 |
| 4,069,456 | 1/1978 | Bensussan et al. | 328/165 |
| 4,156,196 | 5/1979 | Someno et al. | 455/169 |
| 4,158,814 | 6/1979 | Imazeki et al. | 455/217 |
| 4,361,819 | 11/1982 | Sillard et al. | 333/17 L |
| 4,430,619 | 2/1984 | Epsom et al. | 328/162 |

Primary Examiner—Jin F. Ng
Assistant Examiner—Andrew J. Telesz, Jr.
Attorney, Agent, or Firm—Michael H. Wallach; Robert F. Rotella

[57] ABSTRACT

An overload protector, using a power-dissipating element for receiving and dissipating excessive radio-frequency power, can safely transfer a signal from an input to an output. The protector also has a detector coupled to the input for providing a bias current in response to an input signal in excess of a predetermined magnitude. Also included in a diverter coupled to the input, the output, the power-dissipating element and the detector. This diverter can receive the bias current and can, in response, redirect power at the input from the output to the power-dissipating element.

32 Claims, 5 Drawing Figures

FIG. 1
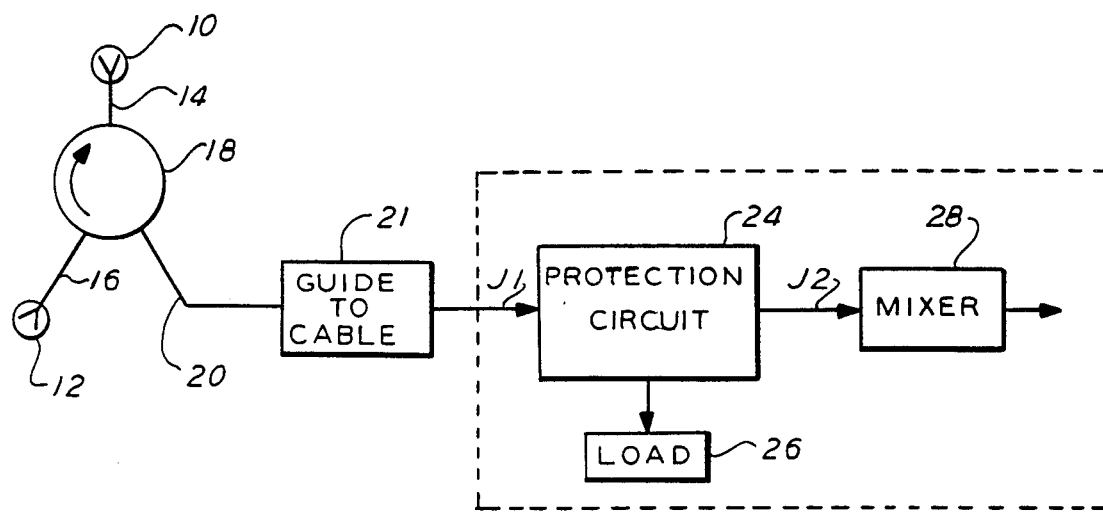
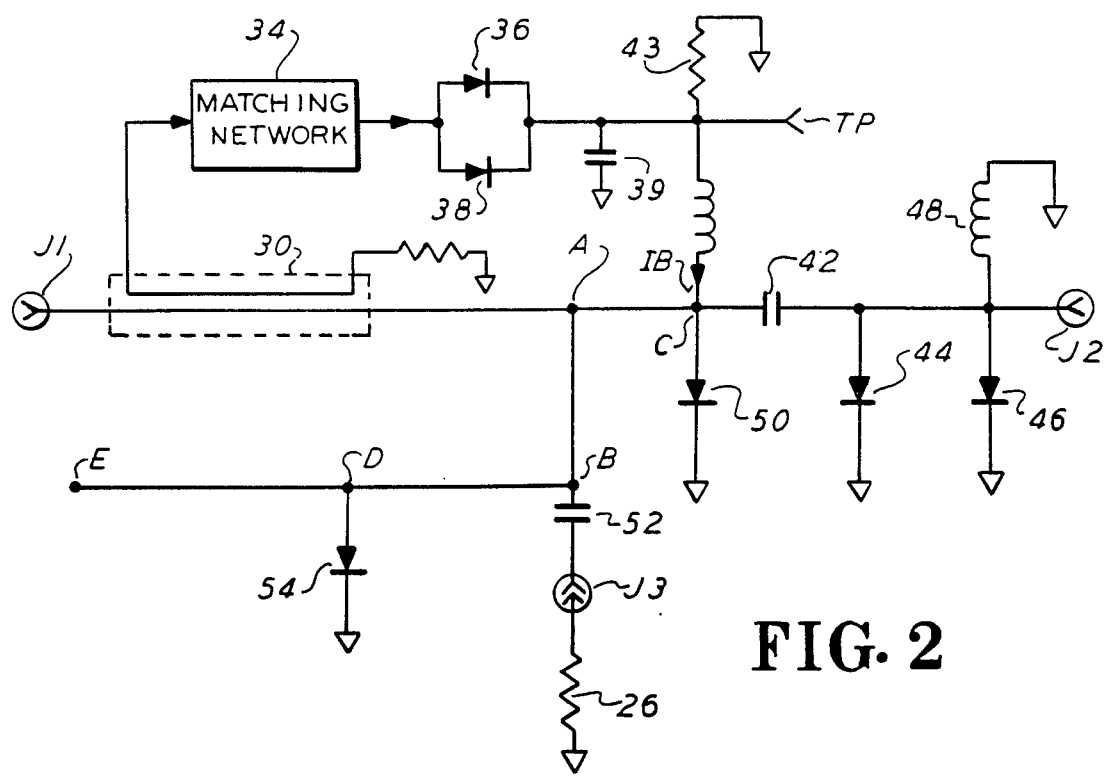
FIG. 2

OVERLOAD PROTECTOR

This is a continuation of co-pending application Ser. No. 589,812, filed on Mar. 15, 1984, now abandoned.

BACKGROUND OF THE INVENTION

The present invention relates to overload protectors for preventing excessive radio-frequency energy, applied to an input, from reaching an output.

There are many applications in which a delicate input circuit must be protected from excessive voltages, current or power. For example, certain field effect transistors and other devices cannot tolerate excessive voltage at their inputs. Other examples include the input to certain receivers. For example, in aircraft weather radar systems, the input to a mixer can be damaged by excessive power emanating from nearby radio sources or reflected power originating from the radar itself. Radar systems are especially susceptible to overloading because they incorporate an antenna serving the dual function of transmitting relatively high energy pulses and receiving very faint signals of the same form. In the event such an antenna is damaged or broken off, it is likely that these high energy pulses will not be safely transmitted but will be coupled directly into the input of the radar receiver.

Such radar systems have been very difficult to protect. Known methods of protecting the radar have included rotating the weather radar antenna so it would not receive damaging signals from reflections or from other nearby, operating radar systems until the aircraft has left the heavily trafficked area. One unsuccessful method for protecting the radar system is to turn off its power. However, even when power has been removed, the radar front end and its sensitive components are still exposed to receipt of damaging energy from nearby high frequency sources.

A known technique for protecting a sensitive input is by shunting the input with one or more stages of pin diodes. A relatively large, radio frequency signal placed across the pin diodes will forward bias them. The forward biasing will persist because of the capacitance of the diode. This approach is inherently limited since this power must be absorbed by the pin diode which must therefor have a high power rating. Consequently, the pin diode tends to be rather slow and will allow substantial power to reach the protected circuit before the diode becomes effective. Moreover, pin diodes do not provide a perfect short but will only reduce the dynamic shunting impedance across the input of the protected circuit.

With high frequency circuits it is often desirable and practical to take advantage of the relatively short wavelengths of signals propagating through a circuit. For example, a transmission line may have one end shorted or open but depending upon the effective electrical length of the transmission line, the other end can appear as either an open or short circuit. Similarly, depending upon the spacing of ports on a transmission line, either complete or no coupling will occur between ports. This phenomena is used in circulators, directional couplers and hybrid couplers. These various effects can be produced with waveguides, cables, microstrips, strip lines and through known equivalent circuits that simulate the effect of a transmission line.

Accordingly, there is need for a device for protecting a delicate circuit by interrupting a higher energy power flow more quickly and more completely than has been possible with systems of the prior art.

SUMMARY OF THE INVENTION

In accordance with the illustrative embodiment demonstrating features and advantages of the present invention, there is provided an overload protector for safely transferring signals from an input to an output. The protector has a power-dissipating element, a detection means and a diversion means. The detection means is coupled to the input for providing a bias current in response to a signal at the input in excess of a predetermined magnitude. The diversion means is coupled to the input, the output, the power-dissipating element and the detection means. The diversion means can receive the bias current and, in response, redirect power at the input from the output to the power-dissipating element.

In one embodiment, protection is provided to a high frequency detection system having an antenna, a high frequency power source and a power-dissipating element. The detection system also has a phased means having at least a first, a second and a third port. The first and second ports are connected to the antenna and power source, respectively. The first port is phased to communicate with the second and third ports. The second and third ports, however, are phased to prevent communication between them. Also included is a processing means for responding to signals having a predetermined pattern to produce a detected signal. The detection system also has a protector means coupled to the power-dissipating element, the third port and the processing means for diverting signals issuing at the third port from the processing means to the power-dissipating element. Thus, the processing means is protected from excessive signals.

An embodiment of a protector according to the principles of the present invention can selectively transfer power from an input to an output. The protector employs a diversion transmission means coupled between the input and a power-dissipating element for conveying power therebetween. A reflex means of the protector is coupled to the diversion transmission means for reflecting power thereon away from the power-dissipating means. The protector includes an operative means for altering the extent of reflection provided by the reflex means. Thus, the protector can divert power from the output to the power-dissipating element.

By employing devices of the foregoing type, a highly effective protector is achieved that can quickly and completely divert power from a protected circuit to power-dissipated component. In a preferred embodiment, the input is coupled through a directional coupler to a node marking the start of two quarter wavelength branches. One branch extending toward the protected circuit is shunted by a first limiter diode, the other line terminating in a power-dissipating resistor. A controllable stub connected to this power-dissipating resistor has another shunting limiter diode connected at a spacing of one quarter wavelength from the power-dissipating resistor. Preferably, these diodes are forward biased by a Schottky diode detector driven by the directional coupler. Thus, an excessive signal can effectively reconfigure the circuit to detour the damaging power.

The protector can be extremely fast since these Schottky diodes can be designed to respond almost immediately to the excessive incoming power by producing a rectified current. The system, which is a passive apparatus, can be designed to switch off in five to twenty nanoseconds or better depending upon the components chosen and the input power to be switched off. In one constructed embodiment the protector was rated for handling 1.5 kilowatts with a 16 microsecond pulse width (duty cycle of 0.003) and a 1.2 microsecond recovery time.

By switching the power to an external load, the protector can be constructed from microstrips which might otherwise be damaged. Thus, notwithstanding unintended loading due to mismatching, a greatly improved power handling capability, about one order of magnitude greater, is achieved because the redirecting of power keeps real power at the diode an order of magnitude lower than the maximum rating of the diode.

BRIEF DESCRIPTION OF THE DRAWINGS

The above brief description, as well as other objects, features and advantages of the present invention, will be more fully appreciated by reference to the following detailed description of a presently preferred but nonetheless illustrative embodiment in accordance with the present invention when taken in conjunction with the accompanying drawings, wherein:

FIG. 1 is a schematic block diagram of a high frequency detection system including an overload protector according to the principles of the present invention;

FIG. 2 is a more detailed schematic of the overload protector of FIG. 1;

DETAILED DESCRIPTION OF THE PREFERRED EMBODIMENT

Figure 3:
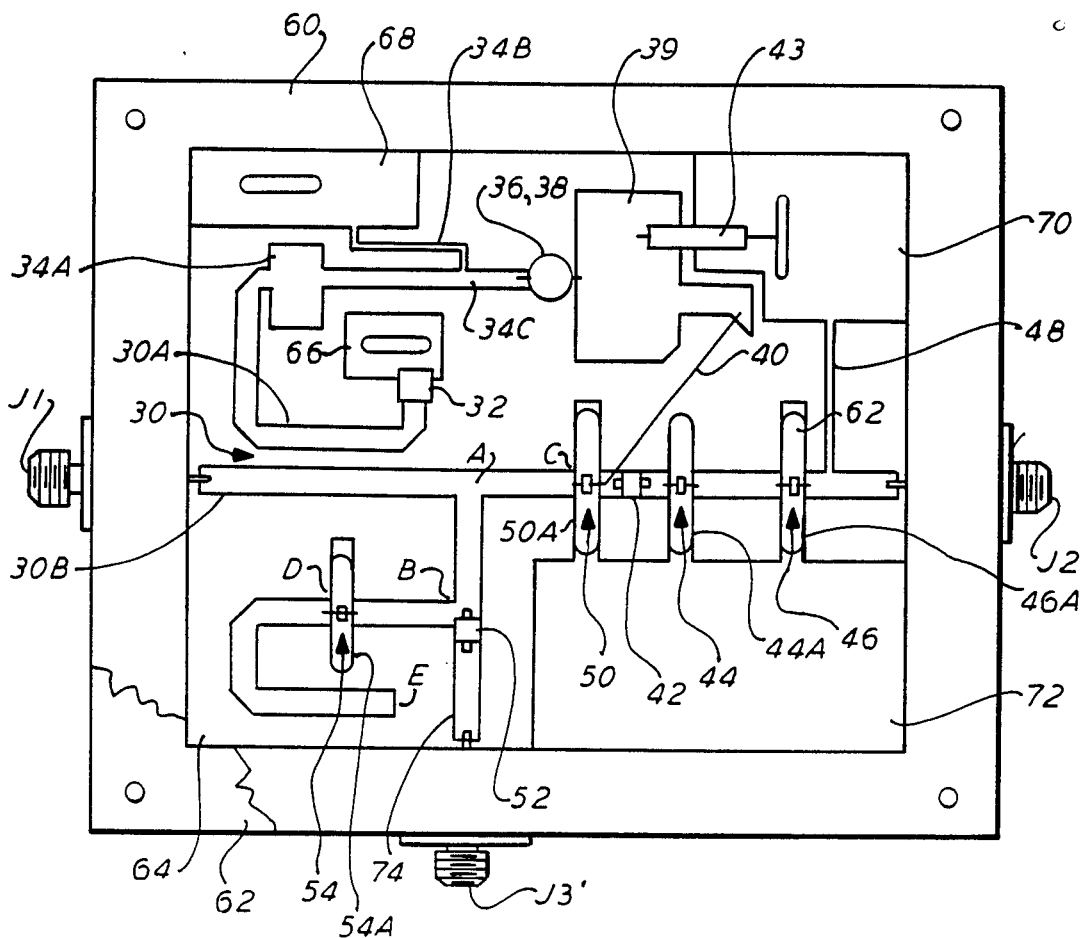
FIG. 3 is plan view of a microstrip version of the circuit of FIG. 2.

In FIG. 1 a high frequency detection system, such as an aircraft weather radar system, operating at 9.35 GHz, is illustrated. It will be understood that this environment is exemplary and various other sensitive systems operating at other frequencies can be protected instead. In this specification the term radio-frequency means frequencies above audio and below infrared. The illustrated radar system includes antenna 10 and magnetron 12 connected to a first port 14 and second port 16, respectively, of a phased means, shown herein as waveguide circulator 18. Circulator 18 is phased so that antenna 10 can communicate with either magnetron 12 or third port 20 but third port 20 and magnetron 12 (a high frequency power source) do not intercommunicate. Waveguide port 20 is connected through waveguide to coaxial cable transition 21 to input J1 of an overload protector comprising protection means 24 and power-dissipating element 26. Transition 21 may be a commercially available device in which a waveguide terminates with an internal conductive probe acting as the center line of a coaxial cable. The output J2 of protector 24 connects to the input of a processing means, shown herein as the front end or mixer of a radar receiver. Mixer 28 and its associated circuitry may be the conventional radar circuit found in an aircraft weather radar system, although other sensitive circuits may be protected instead.

Referring to FIG. 2, the previously mentioned overload protector is illustrated in a more detailed schematic diagram showing power-dissipating element 26 as an external grounded load. Element 26 is connected to connector J3 which may be an OSM-type of connector. Input J1 (an OSM-type female connector) connects to one port of directional coupler 30 whose corresponding port connects to node A. The two other corresponding ports of directional coupler 30 are separately connected to a matching 50 ohm resistor 32 and to the input of a matching network 34. Matching network 34 is designed to correct impedance mismatches that might otherwise exist between the circuitry served by it. The input J1 is designed to work into a 50 ohm characteristic impedance. Directional coupler 30 is designed to have a $-33$ dB coupling between input J1 and the input of matching network 34. Directional couplers such as coupler 30 are known per se. See for example, Members of the Staff of the Radar School, M.I.T., *Principles of Radar*, McGraw-Hill Book Co., Inc. (1952). pp. 834–39; Dr. Max Fogiel, *Modern Microelectronics*, Research and Education Association, New York, New York (1972) pp. 222–25. As explained in those references, directional couplers can be fabricated from waveguides, cables, strip lines or microstrips and the same phenomena can be produced with an equivalent circuit composed of inductors and capacitors. In this embodiment, directional coupler 30 is designed to afford duplex communication between input J1 and node A.

The output of matching network 34 connects to a detection means (also referred to as an operative means) in the form of a pair of unidirectional conducting devices 36 and 38. Devices 36 and 38 are preferably Schottky diodes (for example type DMJ, manufactured by Alpha Industries of Woburn, Mass.) having both of their anodes connected to the output of matching network 34.

A low pass filter means includes a shunting storage capacitor 39 connecting between ground (that is, a reference potential) and the junction of test point TP and the cathodes of diodes 36, 38. The filter means includes an inductor or choke 40 connecting between test point TP and node C. Also, a 68 ohm carbon composition, direct-current return resistor 43 is shown connected between ground and test point TP.

Configured in this fashion, a sufficiently large signal at input J1 can forward bias diodes 36 and 38 which then act as detectors for producing a voltage across capacitor 39 and a bias current IB through inductor 40 to node C.

Node C is coupled through beam lead capacitor 42 (10 pF) to the anodes of parallel limiter diodes 44 and 46 whose cathodes are grounded. For the specified operating frequency diode 44 may have a recovery time of 20 nanoseconds and diode 46, 10 nanoseconds. Diodes 44 and 46 may be pin diodes, type numbers CLA 3132-02 and CLA 3131-01 respectively, by Alpha Industries of Woburn, Mass. A direct current return is provided by inductor 48 which connects between ground and the junction of the anodes of limiter diodes 44 and 46 and the output connector J2.

The balance of the circuitry of FIG. 2 is herein referred to as a diversion means. Line A–C between nodes A and C is referred to herein as a main (or as a third) transmission means. Line A–C is preferably a quarter wavelength transmission line which may be formed from microstrips, although embodiments employing waveguides, cables or other equivalent circuits are possible. A variable impedance is provided by a semiconductor, limiting diode 50, herein referred to as a cancellation (or as an interrupt) means. Limiting diode 50 has its anode connected to node C and its cathode grounded. In one preferred embodiment, diode 50 is a pin diode, type CLA 3133-03 manufactured by Alpha Industries, Woburn, Mass., having a recovery time of 50 nanoseconds. Another quarter wavelength line segment between nodes A and B, line segment A–B, is similar to line A–C and is referred to as diversion transmission means. Node B is coupled through capacitor 52 (a capacitor identical to capacitor 42) and OSM connectors J3 to 50 ohm matching termination 26. Line B–D, a second transmission means connected between nodes B and D, is another quarter line similar to the two other lines, line A–C and line A–B. A shunting means (also referred to as a reloading or reflex means) is shown as a shunting diode 54 with its anode connected to node D and its cathode grounded. Diode 54 is a semiconductor providing variable impedance (that is, an impedance varying diode) and may be identical to previously mentioned diode 50. A fourth transmission means, line D–E, is connected between node D and node E and is serially connected with line B–D to form a line stub. In a preferred embodiment line D–E is effectively one half wavelength long.

Referring to FIG. 3, a practical embodiment of the circuit of FIG. 2 is illustrated as a microstrip circuit. It will be understood that this circuit could be fabricated with discrete components where the various transmission lines are synthesized by an equivalent circuit, especially for lower frequencies. Alternatively, the circuit could be made with waveguides although the latter would be substantially more difficult to fabricate. The illustrated circuit employs a four-walled aluminum frame 60 onto which are mounted the three previously mentioned OSM-type connectors J1, J2 and J3'. The outer conductive cowls of connectors J1, J2 and J3 are screw mounted to aluminum frame 60.

The interior circuitry is mounted on a microstrip board comprising an aluminum ground plane 62, electrically and physically connected to frame 60 and having the same outside dimensions as it. On the side of frame 60 opposite plane 62 an identically sized aluminum cover plate (not shown) is attached by screws to the frame. Ground plane 62 has laminated to its inside face a low loss dielectric material, preferrably composed of polytetrafluoroethylene which is 0.010 inch thick. The various conductive strips illustrated upon dielectric material 64 are metal laminations which may be photochemically etched into the pattern shown. Microstrip board material can be obtained from Rogers Co., of Chandler, Ariz., the dielectric material being referred to as RT/Duroid 5880. In this schematic components previously described in FIG. 2 bear identical reference numerals.

The majority of the illustrated strip lines are dimensioned to provide a 50 ohm characteristic impedance. Specifically, the strip line aligned between connectors J1 and J2, the previously mentioned lines A–B, B–D, D–E, as well as the line between connector J3' and node B, are all designed to have a 50 ohm characteristic impedance. The width of these 50 ohm strip lines is 0.031 inch. Similarly designed is the strip line 30A running between elements 34A and 32 in the directional coupler.

The directional coupler 30 includes a strip 30A which is spaced about 0.035 inch from strip 30B for approximately 0.225 inch. Directional coupler 30 is designed to operate at an input frequency of 9.35 GHz with −33 dB coupling from input J1 to element 34A. The right end (in this view) of strip 30A is terminated by previously mentioned chip resistor 32 which connects to grounded pad 66. Pad 66 is a metal lamination resting atop dielectric material 64 but having a slot cut therethrough and reaching the aluminum ground plane 62. This typical slot is approximately 0.13 inch long and 0.031 inch wide with rounded ends. The slot is connected to ground plane 62 by soldering pad 66 to the ground plane 62.

Previously mentioned matching network 34 is shown herein as shunting capacitive element 34A, a widened metallic pad for capacitively shunting signals to the underlying ground plane 62. A strip line (also 0.031 inch wide) then reaches from shunting capacitor 34A to previously mentioned Schottky diodes 36, 38, shown herein as a parallel combination, hermetically sealed into a common package by the manufacturer. The strip 34C between component 34A and 36 is shunted about approximately two thirds of the way towards component 36 by strip line inductor 34B which connects to grounding pad 68, a pad again having a soldering slot for connecting to ground plane 62. Strip 34B is a quarter-wave, direct current return acting as a radio-frequency choke. Components 34A and 34C provide an impedance matching network so that the 50 ohm strip line from strip 30A is matched to the lower impedance presented by Schottky diodes 36, 38. The dimensions and thus the values of elements 34A and 34C are selected according to the impedance at diodes 36, 38.

A shunting storage capacitor 39 is formed by the area of pad 39 which is approximately 0.04 square inch. Previously mentioned direct-current return resistor 43 connects between pad 39 and the illustrated (typical) slot in grounded pad 70. A strip inductor, 0.007 inch wide and 0.242 inch long connects between pad 70 and the strip line running between connector J2 and diode 46, at a point nearer to the diode. Diode 46 is generally in the shape of a cubical chip having terminals formed on opposing faces. Its cathode face is solder-connected to ground plane 62 exposed through the slot 46A cut through dielectric material 64. Area 72 is grounded to prevent bypass currents. The anode of diode 46 is connected to the microstrip on either side of slot 46A by a 99.99% pure gold ribbon, 0.005 inch by 0.0025 inch. A gap in the microstrip between diodes 44 and 50 is spanned by beam lead capacitor 42. Previously mentioned diodes 44 and 50 are situated in slots 44A and 50A, respectively, (similar to slot 46A) so that each of their cathodes connect to ground plane 62. Again, their anodes connect to a gold ribbon spanning the slots 50A and 44A.

The anode of diode 50 connects to previously mentioned node C. The microstrip between nodes C and A is the previously mentioned quarter wavelength transmission strip and is, in this embodiment, approximately 0.190 inch long, in view of the operating frequency of 9.35 GHz. Of approximately the same length is the perpendicular microstrip line running from node A to node B. Soldered between node B and strip 74 is beam lead capacitor 52. Strip 74 leads to load connector J3'. The strip between node B and node D is similar in length to line A–B. At node D limiter diode 54 is soldered within slot 54A atop ground plane 62. Again, the anode of diode 54 connects to a gold ribbon spanning either side of slot 54A. A folded microstrip between node D and E is approximately twice the length of strip B–D and is open at node E.

Figure 4A:
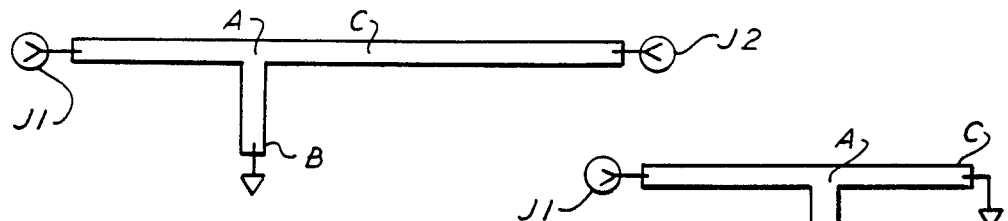
FIG. 4A is a simplified, partial, equivalent circuit diagram illustrating some of the microstrip transmission lines of FIG. 3 when power is being conveyed from input to output.
Figure 4B:
FIG. 4B is a circuit diagram similar to that of FIG. 4A but showing conditions existing when power is being conveyed from the input to a power-dissipating element.

To facilitate an understanding of the principles associated with the foregoing apparatus, the operation of the equipment of FIGS. 1, 2 and 3 will be explained using the simplified schematic of FIGS. 4A and 4B. In FIG. 1, circulator 18 operates such that high frequency power from magnetron 12 is transferred to antenna 10 in short bursts without coupling a significant signal into port 20. Signals reflected by targets eventually cause a return to be received by antenna 10 and coupled through circulator 18 into port 20. After passing through transition 21 the return signal is coupled to input connector J1 of protector 24.

The relatively small signal appearing at connector J1 does not produce a sufficient signal to charge capacitor 39 (FIG. 2). Accordingly, any current IB through inductor 40 is negligble. Thus diodes 54 and 50 are not forward biased and remain essentially a very high impedance (an open circuit). As a result, the open circuit at node E still appears as an open circuit at node D. One quarter wavelength therefrom at node B this open circuit appears like a short across load 26. This short at node B causes the line A-B to appear like an open circuit from node A. Since there are no other diodes or other components shunting the energy in the microstrip connection between connectors J1 and J2, signals are conveyed without reflection between those connectors. An equivalent circuit of the microstrip under these conditions is shown in FIG. 4A, wherein node B is shown grounded to produce what appears to be an open circuit when viewed from node A.

Referring again to FIG. 1, we now assume that the magnetron pulse applied to antenna 10 is reflected back into port 14 due to a nearby obstruction or due to damage to antenna 10. This pulse is therefor at a relatively high power level. Alternatively, a nearby radar signal, a likely happening at a crowded airport, can be directed into antenna 10 to produce an excessive signal at port 14. Consequently, an excessive signal is conveyed from port 20 to connector J1. This pulse may typically rise at the rate of 10 watts per nanosecond.

Accordingly, a significant amount of energy is coupled from the directional coupler 30 (FIG. 2) through matching network 34 to detecting diodes 36, 38. The high speed rectification provided by them causes a rapid charging of capacitor 39. Consequently, a bias current IB, eventually reaching about 60 mA flows through inductor 40 and forward biases diodes 54 and 50. This current dramatically reduces their dynamic impedance and presents an effective short circuit from their anodes to cathodes. These effective short circuits cause the grounding of the microstrips as illustrated in FIG. 4B. Nodes C and D have been grounded by their respective limiter diodes as illustrated in FIGS. 2 and 4B. Since the line A-C, having its node C grounded, is a quarter wavelength long, the effect of line A-C as seen from node A is that of an open circuit. Similarly, line B-D has its node D grounded so that the line appears from node B as an open circuit. Consequently, there is an undisturbed signal path from input connector J1 through line A-B and connector J3 to power-dissipating element 26. Therefore, the excessive power on connector J1 is dissipated externally. Moreover, the effective open circuit presented by line A-C provides excellent isolation to keep destructive power from ever reaching the protected circuits.

It will be appreciated that as the input power rises, should any of it leak past line A-C, additional protection is provided by diodes 44 and 46 (FIG. 2). Such leaked power can forward bias diodes 44 and 46. These diodes have a certain amount of capacitance so that they effectively remain forward biased to shunt power so that any signal reaching output connector J2 is relatively small. Significantly, diode 44 and especially diode 46, can be selected to have a very fast response since these diodes need not dissipate much energy.

When the excessive signal ceases, all of the diodes can return to a relatively non-conducting state. For example, diodes 44 and 46 can be discharged through inductive choke 48. Similarly, capacitor 39 as well as diodes 50 and 54 can be discharged through resistor 43 which is effectively connected in parallel across them.

With the just described embodiment, the bias current IB can be generated rather quickly (5 to 20 nanoseconds). However, the return to normal operation is designed to take somewhat longer, up to 1.2 microseconds, and is a function of the pulse width and the power level applied. This recovery time is limited by the time constant established by resistor 43. Also, another limiting factor is the recovery time associated with diodes 44, 46, 50 and 54, especially the latter two. Once these elements discharge the system is then in a condition to operate as originally described with power flowing from input J1 to output J2, essentially no power being conveyed to power-dissipating element 26.

It is to be appreciated that various modifications may be implemented with respect to the above described preferred embodiment. For example, the power rating of the foregoing system can be changed by the expedient of specifying diodes with a different power rating or by placing more or fewer diodes in parallel to change the effective power rating. Additionally, it is possible to change the size of the microstrip by simultaneously changing the dielectric constant of the underlying non-conductive material. Also, while a directional coupler is shown driving the detector for producing bias current, alternate coupling techniques can be employed, including an ohmic connection. Also, in many cases a quarter or half wavelength line can be increased by multiples of half wavelengths without changing the effect of the system. Also, while a 50 ohm characteristic impedance is disclosed, clearly, in alternate embodiments, other impedances can be employed. Furthermore, while a microstrip configuration has been shown, discrete hard wired components, waveguide systems, stripline systems or coaxial cable systems can be employed depending upon the required power handling capability, reliability, weight and size limitations, etc. Additionally, the values of components and the specific components selected can be changed depending upon the required frequency, band width, power handling capability, temperature stability, accuracy, leakage requirement, interference immunity, etc. Also, while the protector has been shown guarding the input to a radar receiver, any system for receiving an oscillating signal can be protected by the foregoing circuit. In addition, short circuits provided by the illustrated diodes can be accomplished by other devices including transistors, or other fast switching devices. It will be further appreciated that while in some instances a diode produces a shorting effect resulting in an open circuit, the length of an associated transmission line can be altered so that an open/shorted diode can produce either an open or short circuit.

Obviously, many modifications and variations of the present invention are possible in light of the above teachings. It is, therefore, to be understood that within the scope of the appended claims, the invention may be practiced otherwise than as specifically described.

What is claimed is:

1. An overload protector, operating at at least a radio-frequency for safely transferring signals from an input to an output, said overload protector producing the power required for operation of said overload protector entirely from a signal at said input in excess of a predetermined magnitude, said overload protector comprising:
   a power-dissipating element;
   a detection means coupled to said input for producing a bias current in response to a signal at the input in excess of a predetermined magnitude; and
   diversion means coupled to said input, to said output, to said power-dissipating element and to said detection means for receiving said bias current, said diversion means being operable in response to said bias current to redirect power at said input away from said ouptut to said power-dissipating element, said diversion means including reloading means connected to said power-dissipating element for gating thereto signals from said input in response to said bias current; said diversion means further being comprised of a diversion transmission means coupled between said input and said power-dissipating element for conveying signals therebetween; and a second transmission means coupled between said reloading means and said power-dissipating element for conveying signals therebetween, said diversion transmission means and said second transmission means each being in effect longer than one-eighth of the wavelength of the radio frequency signals therein.

2. An overload protector according to claim 1 wherein said first transmission means is in effect an odd multiple of quarter wavelengths long.

3. An overload protector according to claim 2 wherein said second transmission means is in effect an odd multiple of quarter wavelengths long.

4. An overload protector according to claim 3 wherein said diversion means comprises:
   interrupt means for decoupling said input and output in response to said bias current; and
   a third transmission means coupled between said interrupt means input and the junction of said input and said first transmission means for conveying signals therebetween, said third transmission means being in effect an odd multiple of quarter wavelengths long.

5. An overload protector according to claim 4 wherein said diversion means comprises:
   a fourth transmission means, open at one end and connected at its other end to the junction of said reloading means and said second transmission means, said fourth transmission means being in effect a multiple of half-wavelengths in length.

6. An overload protector, operating at at least a radio-frequency for safely transferring signals from an input to an output, said overload protector producing the power required for operation of said overload protector entirely from a signal at said input in excess of a predetermined magnitude, said overload protector comprising:
   a power-dissipating element;
   a detection means coupled to said input for producing a bias current in response to a signal at the input in excess of a predetermined magnitude;
   diversion means coupled to said input, to said output, to said power-dissipating element and to said detection means for receiving said bias current, said diversion means being operable in response to said bias current to redirect power at said input away from said output to said power-dissipating element; and
   a directional coupler having two pairs of ports, duplex transmission occurring within each pair, one pair being separately connected to said input and said diversion means, from the other pair of ports at least one of said ports being connected to said detection means.

7. An overload protector according to claim 6 further comprising:
   a limiter diode connected between a reference potential and the junction between said output and said diversion means.

8. An overload protector according to claim 7 wherein said diversion means comprises:
   reloading means connected to said power-dissipating element for coupling thereto signals of said input in response to said bias current; and
   interrupt means for decoupling said input and output in response to said bias current.

9. An overload protector according to claim 8 wherein said detection means comprises a relatively high-speed Schottky diode.

10. An overload protector according to claim 8 wherein said reloading means and said interrupt means each comprise:
    an impedance varying diode connected for forward biasing by said bias current.

11. An overload protector according to claim 10 wherein said diversion means further comprises:
    a diversion transmission means coupled between said input and said power-dissipating element for conveying signals therebetween; and
    a second transmission means coupled between said reloading means and said power-dissipating element for conveying signals therebetween, said diversion transmission means and second transmission means each being in effect longer than one-eighth of the wavelength of the radio frequency signals therein.

12. An overload protector according to claim 11 wherein said diversion transmission means is in effect an odd multiple of quarter wavelengths long.

13. A radio frequency detection system comprising:
    a radio frequency power source;
    an antenna;
    phased means having at least a first, second and third port, said first and second ports being connected to said antenna and power source, respectively, said first port being phased to communicate with said second and third port, said second and third ports being phased to prevent communication between themselves;
    a power-dissipating element;
    a processing means for responding to signals having a predetermined pattern to produce a detected signal; and
    a protector means coupled to said power-dissipating element, said third port and said processing means for diverting signals issuing at said third port away from said processing means to said power-dissipating element, whereby said processing means is protected from input signals in excess of a predetermined magnitude.

14. A radio frequency detection system according to claim 13 wherein said phased means comprises a waveguide circulator and said protector means comprises a microstrip circuit, said system further comprising:
   a waveguide to microstrip transition.

15. A radio frequency detection system according to claim 13 wherein said protector means comprises:
   a first transmission strip, effectively one-quarter wavelength long, coupled between said third port and said power-dissipating element for conveying signals therebetween;
   a shunting diode; and
   a second transmission strip, effectively one-quarter wavelength long, coupled between one terminal of said shunting diode and the junction of said power-dissipating elements and said first transmission strip.

16. A radio frequency detection system according to claim 15 further comprising:
   a limiting diode having one terminal coupled to said processing means;
   a third transmission strip, effectively one-quarter wavelength long, coupled between said third port and the junction of said limiting diode and said processing means; and
   a fourth transmission strip, effectively a multiple of half wavelengths long, having one end open and the other end connected to the junction of said shunting diode and said second transmission strip.

17. A protector operating at at least a radio frequency for selectively transferring power from an input to an output, comprising:
   a main transmission means coupled between said input and output for conveying power therebetween;
   a power-dissipating element;
   a diversion transmission means coupled between said input and said power-dissipating element for conveying power therebetween;
   a reflex means coupled to said diversion transmission means for reflecting power on said diversion transmission means away from said power-dissipating element;
   an operative means for producing a bias current for altering the extent of reflection provided by said reflex means; and
   a cancellation means coupled to said main transmission means for reflecting power thereon away from said output, said operative means being operable to alter simultaneously the extent of reflection provided by said reflex and cancellation means;
   whereby said protector can divert power away from said output to said power-dissipating element.

18. A protector operating at at least a radio frequency for selectively transferring power from an input to an output, comprising:
   a main transmission means coupled between said input and output for conveying power therebetween;
   a power-dissipating element;
   a diversion transmission means coupled between said input and said power-dissipating element for conveying power therebetween, said diversion transmission means including a line segment, its length effectively one-quarter of the wavelength of signals thereon, coupled between said power-dissipating element and said input;
   a reflex means coupled to said diversion transmission means for reflecting power on said diversion transmission means away from said power-dissipating element; and
   an operative means for producing a bias current for altering the extent of reflection provided by said reflex means, said operative means being operable to short said power-dissipating element, whereby said protector can divert power away from said output to said power-dissipating element.

19. A protector according to claim 18 wherein said reflex means comprises:
   a line stub, its length effectively three-quarters of the wavelength of signals thereon, having one end open and the other end connected to said power-dissipating element; and
   a shunt means coupled at a mid-section of said line stub for shorting it at an effective distance from said power-dissipating element of one-quarter of the wavelength of signals thereon.

20. An overload protector operating at at least a radio frequency for safely transferring signals from an input to an output, comprising:
   a power-dissipating element;
   a detection means coupled to said input for producing a bias current in response to a signal at the input in excess of a predetermined magnitude;
   diversion means coupled to said input, to said output, to said power-dissipating element and to said detection means for receiving said bias current, said diversion means being operable in response to said bias current to redirect power at said input away from said output to said power-dissipating element; and
   a directional coupler having two pairs of ports, duplex transmission occurring within each pair, one pair being separately connected to said input and said diversion means, from the other pair of ports at least one of said ports being connected to said detection means.

21. An overload protector according to claim 20 further comprising:
   a limiter diode connected between a reference potential and the junction between said output and said diversion means.

22. An overload protector according to claim 21 wherein said diversion means comprises:
   reloading means connected to said power-dissipating element for coupling thereto signals of said input in response to said bias current; and
   interrupt means for decoupling said input and output in response to said bias current.

23. An overload protector according to claim 22 wherein said detection means comprises a relatively high-speed Schottky diode.

24. An overload protector according to claim 22 wherein said reloading means and said interrupt means each comprise:
   an impedance varying diode connected for forward biasing by said bias current.

25. An overload protector according to claim 24 wherein said diversion means further comprises:
   a diversion transmission means coupled between said input and said power-dissipating element for conveying signals therebetween; and a second transmission means coupled between said reloading means and said power-dissipating element for conveying signals therebetween, said diversion transmission and second transmission means each being in effect longer than one-eighth of the wavelength of the radio frequency signals therein.

26. An overload protector according to claim 25 wherein said diversion transmission means is in effect an odd multiple of quarter wavelengths long.

27. An overload protector operating at at least a radio-frequency for safely transferring signals from an input to an output, comprising:
a power-dissipating element;
a detection means coupled to said input for providing a bias current in response to a signal at the input in excess of a predetermined magnitude;
diversion means coupled to said input, to said output, to said power-dissipating element and to said detection means for receiving said bias current, said diversion means being operable in response to said bias current to redirect power at said input away from said output to said power-dissipating element;
a radio frequency source;
an antenna; and
a circulator having at least three ports, one of said ports being connected to said antenna, the other two ports being (a) in communication with the antenna but not with each other, and (b) separately connected to said radio frequency source and said input.

28. An overload protector operating at at least a radio frequency for safely transferring signals from an input to an output, comprising:
a power-dissipating element;
a detection means coupled to said input for providing a bias current in response to a signal at the input in excess of a predetermined magnitude;
diversion means coupled to said input, to said output, to said power-dissipating element and to said detection means for receiving said bias current, said diversion means being operable in response to said bias current to redirect power at said input away from said output to said power-dissipating element, said diversion means including reloading means connected to said power-dissipating element for gating thereto signals from said input in response to said bias current, said diversion means comprising:
a diversion transmission means coupled between said input and said power-dissipating element for conveying signals therebetween and a second transmission means coupled between said reloading means and said power-dissipating element for conveying signals therebetween, said diversion transmission means and second transmission means each being in effect longer than one-eighth of the wavelength of the radio frequency signals therein.

29. An overload protector according to claim 28 wherein said diversion transmission means is in effect an odd multiple of quarter wavelengths long.

30. An overload protector according to claim 29 wherein said second transmission means is in effect an odd multiple of quarter wavelengths long.

31. An overload protector according to claim 30 wherein said diversion means comprises:
interrupt means for decoupling said input and output in response to said bias current; and
a third transmission means coupled between said interrupt means input and the junction of said input and said diversion transmission means for conveying signals therebetween, said third transmission means being in effect an odd multiple of quarter wavelengths long.

32. An overload protector according to claim 31 wherein said diversion means comprises:
a fourth transmission means open at one end and connected at its other end to the junction of said reloading means and said second transmission means, said fourth transmission means being in effect a multiple of half wavelengths in length.

* * * * *